(12) United States Patent
Kameyama et al.

(10) Patent No.: US 7,485,967 B2
(45) Date of Patent: Feb. 3, 2009

(54) SEMICONDUCTOR DEVICE WITH VIA HOLE FOR ELECTRIC CONNECTION

(75) Inventors: Kojiro Kameyama, Ota (JP); Akira Suzuki, Ota (JP); Yoshio Okayama, Sunnyvale, CA (US); Mitsuo Umemoto, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 6 days.

(21) Appl. No.: 11/362,503

(22) Filed: Feb. 27, 2006

(65) Prior Publication Data

US 2006/0202348 A1    Sep. 14, 2006

(30) Foreign Application Priority Data

Mar. 10, 2005    (JP) .............................. 2005-066533

(51) Int. Cl.
*H01L 23/48* (2006.01)
*H01L 23/52* (2006.01)
*H01L 29/40* (2006.01)

(52) U.S. Cl. ............................... 257/774; 257/E21.578

(58) Field of Classification Search ......... 257/758–760, 257/774, E21.578
See application file for complete search history.

(56) References Cited

U.S. PATENT DOCUMENTS

| | | | |
|---|---|---|---|
| 5,149,674 | A | 9/1992 | Freeman et al. |
| 5,229,647 | A | 7/1993 | Gnadinger et al. |
| 5,248,903 | A | 9/1993 | Heim |
| 5,397,907 | A | 3/1995 | Lee |
| 5,432,119 | A | 7/1995 | Le et al. |
| 5,910,687 | A | 6/1999 | Chen et al. |
| 5,949,140 | A | 9/1999 | Nishi et al. |
| 5,985,749 | A | 11/1999 | Lin et al. |
| 6,031,293 | A | 2/2000 | Hsuan et al. |
| 6,204,074 | B1 | 3/2001 | Bertolet et al. |
| 6,281,448 | B1 | 8/2001 | Tsukamoto |
| 6,297,563 | B1 | 10/2001 | Yamaha |
| 6,391,770 | B2 | 5/2002 | Kosaki et al. |

(Continued)

FOREIGN PATENT DOCUMENTS

EP    1376678 A2    1/2004

(Continued)

OTHER PUBLICATIONS

Microchip Fabrication, Peter Van Zant, McGraw-Hill, Fourth Edition, pp. 402-403.

*Primary Examiner*—Monica Lewis
(74) *Attorney, Agent, or Firm*—Morrison & Foerster LLP

(57) ABSTRACT

A semiconductor device with improved reliability and its manufacturing method is offered. The semiconductor device of this invention includes a pad electrode formed on a semiconductor substrate through a first insulation layer, and a via hole formed in the semiconductor substrate and extending from a back surface of the semiconductor substrate to the pad electrode, wherein the via hole includes a first opening of which a diameter in a portion close to the pad electrode is larger than a diameter in a portion close to the back surface of the semiconductor substrate, and a second opening formed in the first insulation layer and continuing from the first opening, of which a diameter in a portion close to the pad electrode is smaller than a diameter in a portion close to the front surface of the semiconductor substrate.

6 Claims, 11 Drawing Sheets

U.S. PATENT DOCUMENTS

| | | |
|---|---|---|
| 6,562,709 B1 | 5/2003 | Lin |
| 6,720,661 B2 | 4/2004 | Hanaoka et al. |
| 6,768,205 B2 | 7/2004 | Taniguchi et al. |
| 6,773,952 B2 | 8/2004 | Armbrust et al. |
| 6,943,442 B2 | 9/2005 | Sunohara et al. |
| 7,045,896 B2 | 5/2006 | Ahn |
| 7,094,701 B2 | 8/2006 | Umemoto et al. |
| 7,101,735 B2 | 9/2006 | Noma et al. |
| 7,214,615 B2 | 5/2007 | Miyazama |
| 7,247,939 B2 | 7/2007 | Huang et al. |
| 7,339,273 B2 | 3/2008 | Kameyama et al. |
| 2002/0025587 A1 | 2/2002 | Wada |
| 2003/0025173 A1 | 2/2003 | Suminoe et al. |
| 2003/0137056 A1 | 7/2003 | Taniguchi et al. |
| 2003/0230805 A1 | 12/2003 | Noma et al. |
| 2004/0016942 A1 | 1/2004 | Miyazawa et al. |
| 2004/0045668 A1 | 3/2004 | Iwasaki et al. |
| 2004/0104485 A1 | 6/2004 | Yokoyama |
| 2004/0188807 A1 | 9/2004 | Hiraoka et al. |
| 2004/0251554 A1 | 12/2004 | Masuda |
| 2005/0023700 A1 | 2/2005 | Singh et al. |
| 2005/0189637 A1 | 9/2005 | Okayama et al. |
| 2006/0087042 A1 | 4/2006 | Kameyama et al. |
| 2006/0108691 A1 | 5/2006 | Kameyama et al. |
| 2006/0108695 A1 | 5/2006 | Kameyama et al. |
| 2007/0249158 A1 | 10/2007 | Okayama et al. |
| 2008/0132038 A1 | 6/2008 | Kameyama et al. |

FOREIGN PATENT DOCUMENTS

| | | |
|---|---|---|
| EP | 1376678 A3 | 1/2004 |
| EP | 1 564 805 A1 | 8/2005 |
| JP | 2003-309221 | 10/2003 |
| JP | 2005-183548 | 7/2005 |
| WO | WO-96/13062 A1 | 5/1996 |
| WO | WO-99/40624 A1 | 8/1999 |

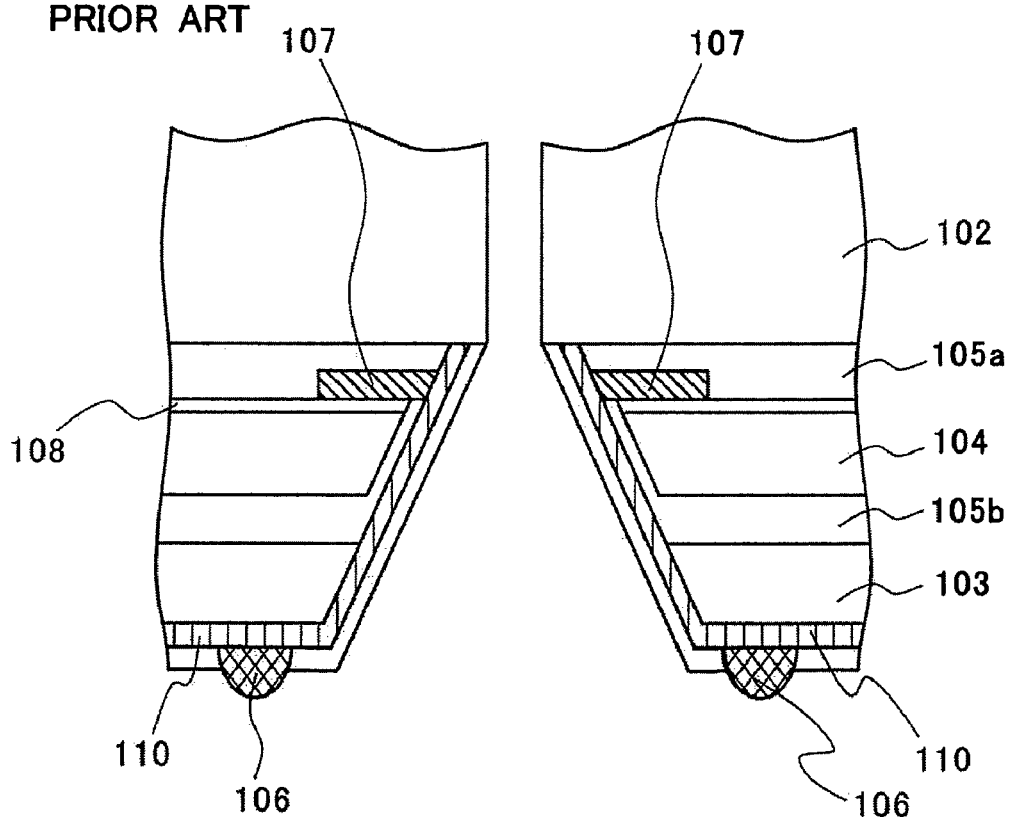

SEMICONDUCTOR DEVICE WITH VIA HOLE FOR ELECTRIC CONNECTION

CROSS-REFERENCE OF THE INVENTION

This invention is based on Japanese Patent Application No. 2005-066533, the content of which is incorporated herein by reference in its entirety.

BACKGROUND OF THE INVENTION

1. Field of the Invention

This invention relates to a semiconductor device and its manufacturing method specifically to a technology to form a via hole exposing a pad electrode formed on a semiconductor substrate from a back surface of the semiconductor substrate.

2. Description of the Related Art

A CSP (Chip Size Package) has received attention in recent years as a three-dimensional mounting technology as well as a new packaging technology. The CSP is a small package having about the same outside dimensions as those of a semiconductor die packaged in it.

A BGA (Ball Grid Array) type semiconductor device has been known as a type of CSP. A plurality of ball-shaped conductive terminals made of a metal such as solder is arrayed in a grid pattern on one principal surface of a package of the BGA type semiconductor device and is electrically connected with the semiconductor die mounted on the other side of the package.

When the BGA type semiconductor device is mounted on electronic equipment, the semiconductor die is electrically connected with an external circuit on a printed circuit board by bonding the conductive terminals to wiring patterns on the printed circuit board.

Such a BGA type semiconductor device has advantages in providing a large number of conductive terminals and in reducing a size over other CSP type semiconductor devices such as an SOP (Small Outline Package) and a QFP (Quad Flat Package), which have lead pins protruding from their sides. The BGA type semiconductor device is used as an image sensor chip for a digital camera incorporated into, for example, a mobile telephone.

FIGS. 14A and 14B show the outline structure of a conventional BGA type semiconductor device. FIG. 14A is an oblique perspective figure of a front side of the BGA type semiconductor device. FIG. 14B is an oblique perspective figure of a back side of the BGA type semiconductor device.

A semiconductor die 104 is sealed between a first glass substrate 102 and a second glass substrate 103 through epoxy resin layers 105a and 105b in the BGA type semiconductor device 101. A plurality of conductive terminals 106 is arrayed in a grid pattern on a principal surface of the second glass substrate 103, that is, on a back surface of the BGA type semiconductor device 101. The conductive terminals 106 are connected to the semiconductor die 104 through a plurality of second wirings 110. The second wirings 110 are connected with wirings of aluminum pulled out from inside of the semiconductor die 104, making each of the conductive terminals 106 electrically connected with the semiconductor die 104.

Further explanation on a cross-sectional structure of the BGA type semiconductor device 101 is given hereafter referring to FIG. 15. FIG. 15 shows a cross-sectional view of the BGA type semiconductor devices 101 divided along dicing lines into individual dice.

A first wiring 107 is provided on an insulation layer 108 on a top surface of the semiconductor die 104. The semiconductor die 104 is bonded to the first glass substrate 102 with the resin layer 105a. The back surface of the semiconductor die 104 is bonded to the second glass substrate 103 with the resin layer 105b.

One end of the first wiring 107 is connected to the second wiring 110. The second wiring 110 extends from the end of the first wiring 107 onto a surface of the second glass substrate 103. And the ball-shaped conductive terminal 106 is formed on the second wiring 110 extended over the second glass substrate 103.

Relevant technology mentioned above is disclosed, for example, in Japanese Patent Application Publication No. 2002-512436.

However, there is a possibility that the first wiring 107 and the second wiring 110 are disconnected at the point of contact between them, since the area of the point of contact is very small in the semiconductor device 101 described above. Also there is a problem in step coverage of the second wiring 110. This invention is directed to solving the problems addressed above and offers a semiconductor device with improved reliability and its manufacturing method.

SUMMARY OF THE INVENTION

The invention provides a semiconductor device that includes a semiconductor substrate having a front surface and a back surface and having a first opening penetrating the semiconductor substrate from the back surface to the front surface, a first insulation layer disposed on the front surface of the semiconductor substrate and having a second opening that is connected to the first opening, and a pad electrode disposed on the first insulation layer so as to cover the second opening. The fist opening has its maximum lateral size in a position closer to the front surface than to the back surface, and the second opening has a larger lateral size at the end that is connected to the first opening than at the end that is covered by the pad electrode.

The invention also provides a method of manufacturing a semiconductor device. The method includes providing a device intermediate having a semiconductor substrate, a first insulation layer disposed on its front surface and a pad electrode disposed on the first insulation layer, forming a first opening in the semiconductor substrate from its back surface so that the first insulation layer is exposed at a bottom of the first opening and that the fist opening has a maximum lateral size thereof in a position closer to the front surface than to the back surface, and removing the exposed first insulation film to form a second opening so that the pad electrode is exposed at a bottom of the second opening and that the second opening has a larger lateral size at the end that is connected to the first opening than at the end that is covered by the pad electrode.

BRIEF DESCRIPTION OF THE DRAWINGS

FIG. 15 is a cross-sectional view showing the semiconductor device of the prior art.

DETAILED DESCRIPTION OF THE INVENTION

Next, a semiconductor device according to a first embodiment of this invention and its manufacturing method will be described, referring to FIGS. 1-7, which are cross-sectional views showing the semiconductor device applicable to an image sensor and its manufacturing method.

Figure 1:
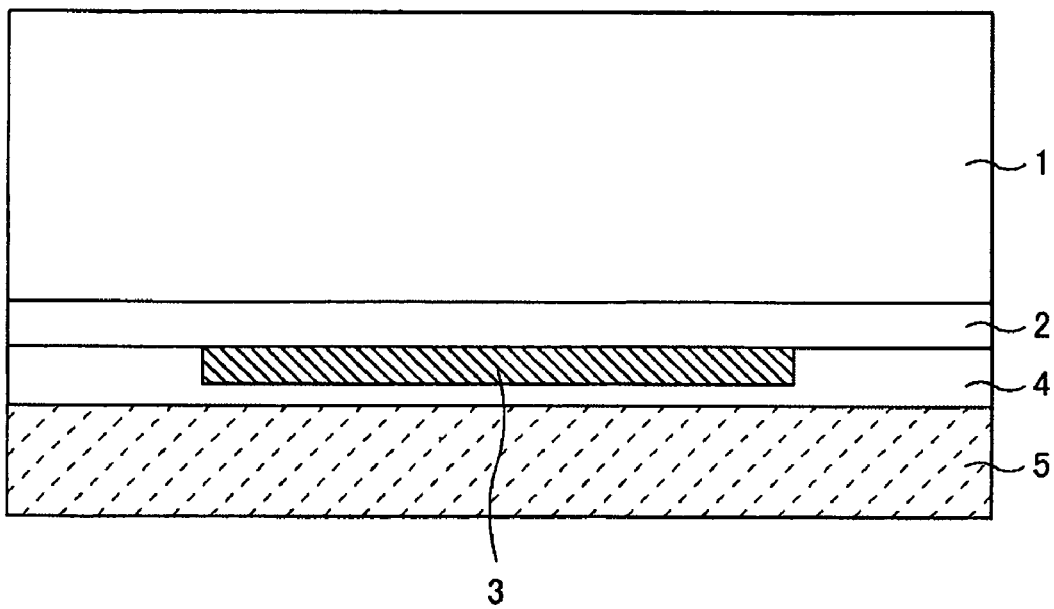
FIGS. 1 to 7 are cross-sectional views showing a method of manufacturing a semiconductor device of a first embodiment of the invention.

First, a pad electrode 3 made of aluminum, an aluminum alloy, or copper is formed on the front surface of a semiconductor substrate 1 through a first insulation layer 2 made of, for example, silicon oxide or silicon nitride, as shown in FIG. 1. The pad electrode 3 is connected with a circuit element in a semiconductor die. Then a supporting body 5 such as a glass substrate, a silicon substrate, a plastic substrate, or the like, is bonded to the semiconductor substrate 1 having the pad electrode 3, which is covered with a passivation film made of silicon oxide or silicon nitride, through an adhesive layer 4 made of an epoxy resin. A tape-shaped protective material may be bonded to the semiconductor substrate 1 instead of the glass substrate, the silicon substrate, the plastic substrate or the like, or a double-faced adhesive tape may be used as a supporting material.

Figure 2:
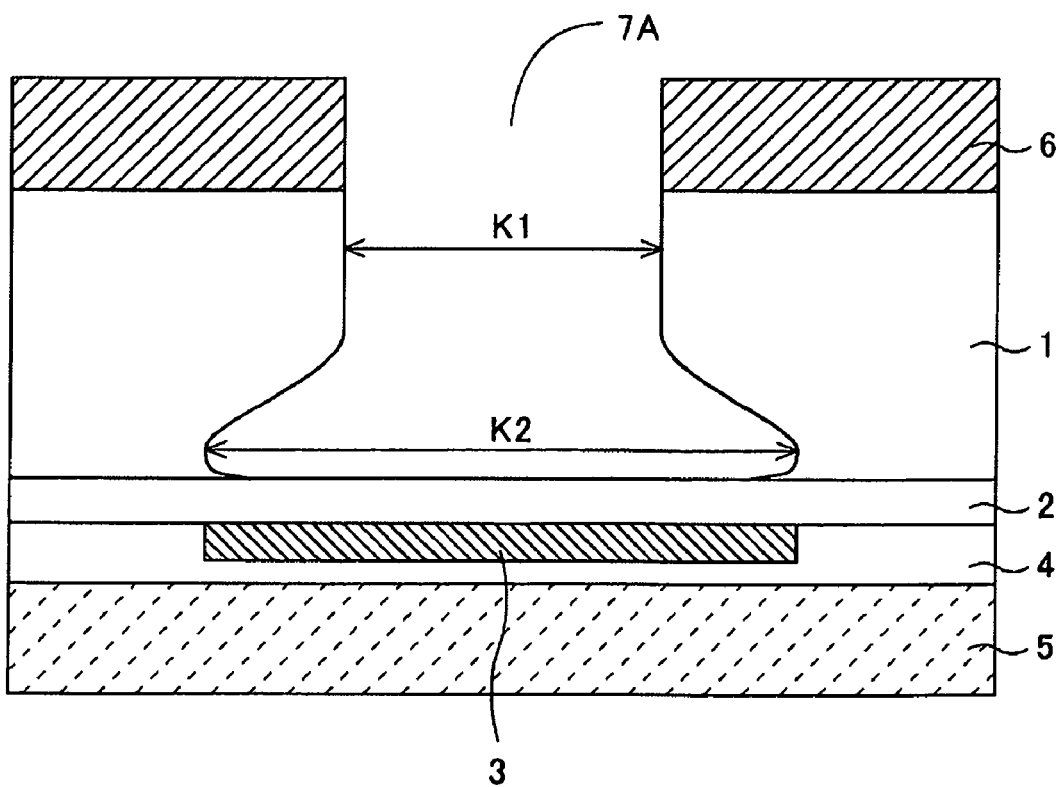

Next, a photoresist layer 6 having an opening corresponding to the pad electrode 3 is formed on the back surface of the semiconductor substrate 1. The semiconductor substrate 1 is dry-etched using the photoresist layer 6 as a mask to form a first opening 7A in the semiconductor substrate 1 extending from the back surface of the semiconductor substrate 1 to the first insulation layer 2 on the pad electrode 3, as shown in FIG. 2. In this process, the semiconductor substrate 1 made of silicon is etched using an etching gas including $SF_6$ and $O_2$, or fluorocarbon such as $C_2F_4$, $C_4F_8$ or $CHF_3$. When the semiconductor subrstrate 1 on the first insulation layer 2 is over-etched in the process, the first opening 7A is formed to have a larger diameter K2 in the portion close to the pad electrode 3 than an diameter K1 in the portion close to the back surface of the semiconductor substrate 1 (K1<K2).

Figure 3:
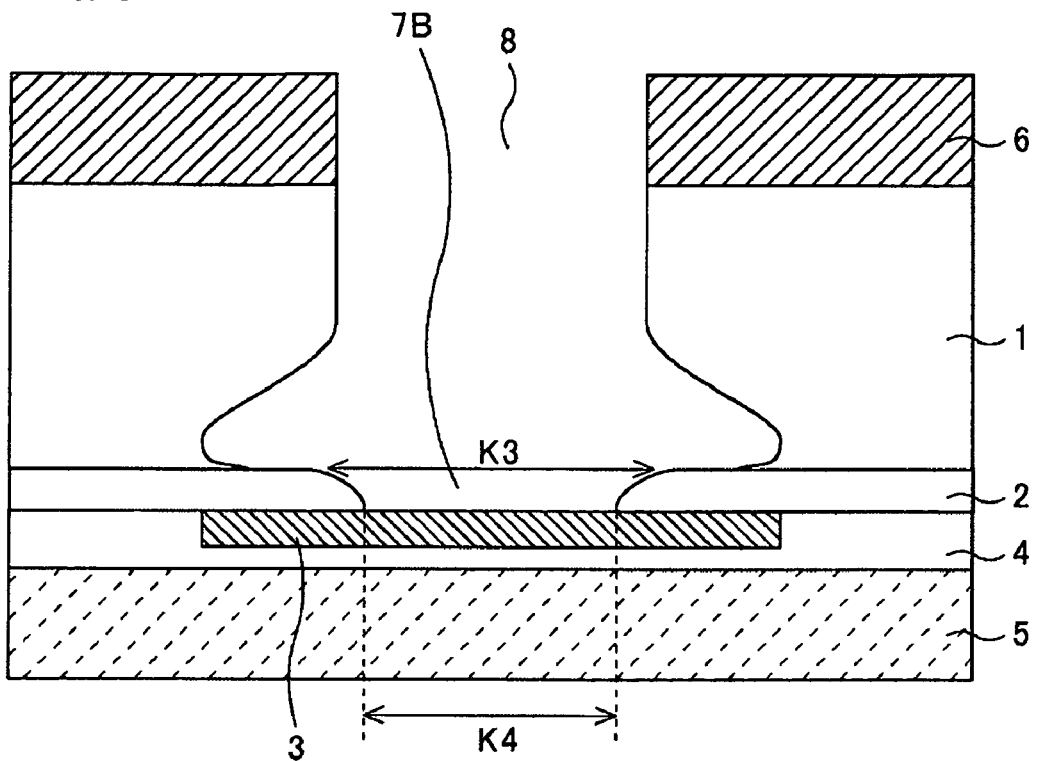

Then, a portion of the first insulation layer 2 on the pad electrode 3 is removed by etching with an etching gas including fluorocarbon such as $CF_4$ or $CHF_3$ using the photoresist layer 6 as a mask to form a second opening 7B exposing the pad electrode 3, as shown in FIG. 3. The second opening 7B is formed in the first insulation layer 2, continuing from the first opening 7A, in which a diameter in a portion close to the pad electrode 3 is smaller than a diameter in a portion close to the front surface of the semiconductor substrate 1. That is, the second opening 7B is formed in a taper shape in which the diameter increases toward the front surface of the semiconductor substrate 1 (K3>K4). In this etching process of the first insulation layer 2, since the first opening 7A is laterally wider and has a larger diameter in a portion close to the pad electrode 3 than in a portion close to the back surface of the semiconductor substrate 1, most of the etching gas entering from the smaller opening at the top of the first opening 7A vertically reaches the first insulation layer 2 on the pad electrode 3, and some of the etching gas obliquely reaches the first insulation layer 2 along the shape of the sidewall of the first opening 7A. Therefore, the pad electrode 3 is exposed in the opening of the first insulation layer 2 which has the taper-shaped sidewall wider in its upper portion, as shown in FIG. 3. The first opening 7A and the second opening 7B form the via hole 8.

Although the first opening 7A is widened in its bottom portion, the diameter K3 of the opening in its upper portion in the first insulation layer 2 on the pad electrode 3 is formed to have about the same size as the diameter of the first opening 7A in the upper portion, since the photoresist layer 6 and the upper portion of the sidewall of the opening 7A serve as a mask to prevent the etching gas from spreading laterally. There can be a case where the diameter K4 is almost the same as the diameter K5 while keeping the relation of K3>K4, depending on the etching condition.

In this process, the etching may be made without using the photoresist layer 6 as the mask. In this case, a portion of the first insulation layer 2 on the pad electrode 3 is removed by an etching using the semiconductor subrstrate 1 as a mask after the photoresist layer 6 is removed.

Figure 4:
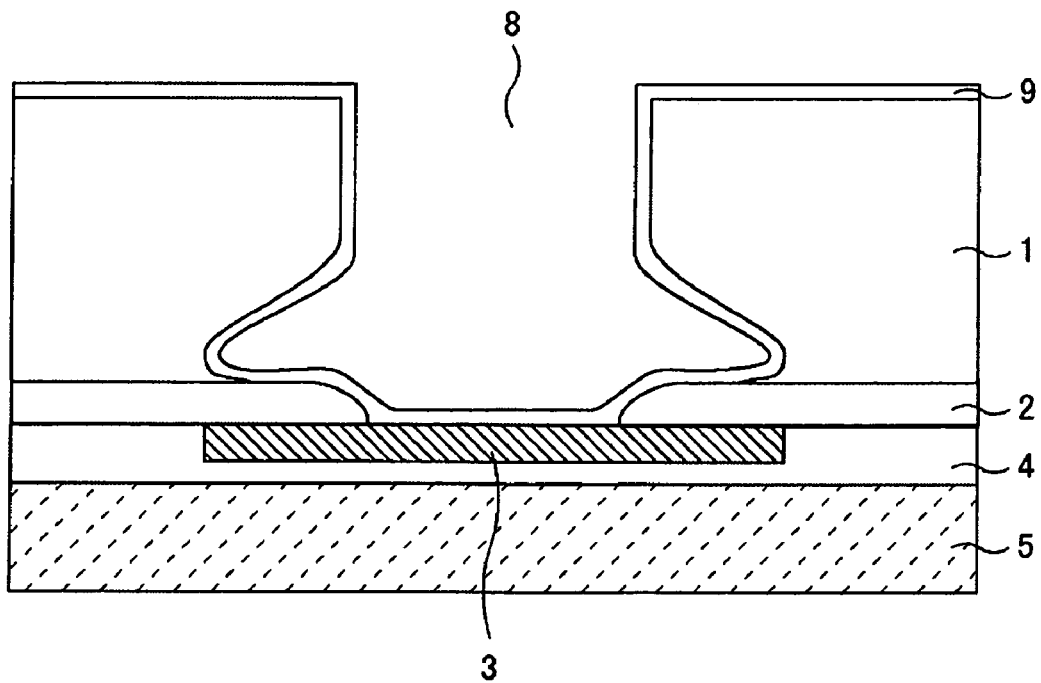
Figure 5:
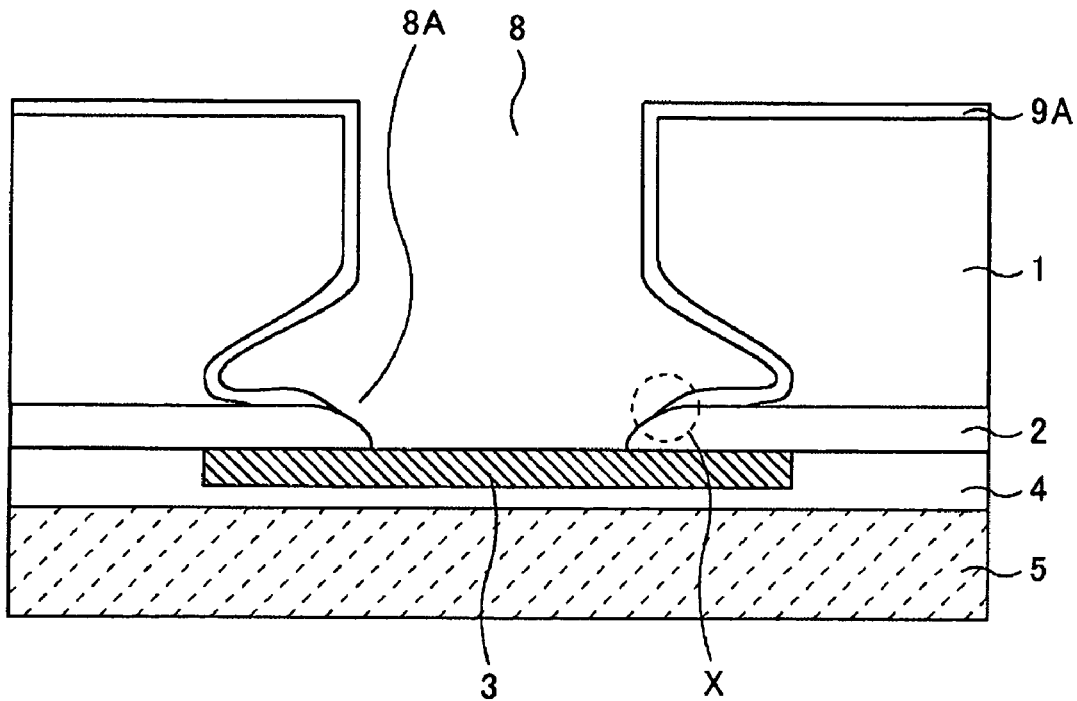

Next, a second insulation layer 9 made of silicon oxide or silicon nitride is formed on the back surface of the semiconductor substrate 1 and an inner surface of the via hole 8 as shown in FIG. 4, a portion of the second insulation layer 9 on the pad electrode 3 is removed to form a second insulation layer 9A on the sidewall of the via hole 8 and on the back surface of the semiconductor substrate 1 as shown in FIG. 5. In this process, the taper-shaped second opening 7B is formed in the first insulation layer 2 on the pad electrode 3, then the semiconductor substrate and an inner surface of the second opening 7B are covered with the second insulation layer 9, and further the second insulation layer 9 is partially etched to expose the pad electrode 3 again. A region of the via hole 8, where an end portion X of the second insulation layer 9A is formed on the first insulation layer 2, is referred to as a third opening. Although FIG. 5 shows the end portion X of the second insulation layer 9A covering a portion of the taper-shaped portion of the first insulation layer 2 and exposing the other portion of the taper-shaped portion, it is possible to form the second insulation layer 9A so as to completely cover the first insulation layer 2 by changing an etching condition.

Figure 12:
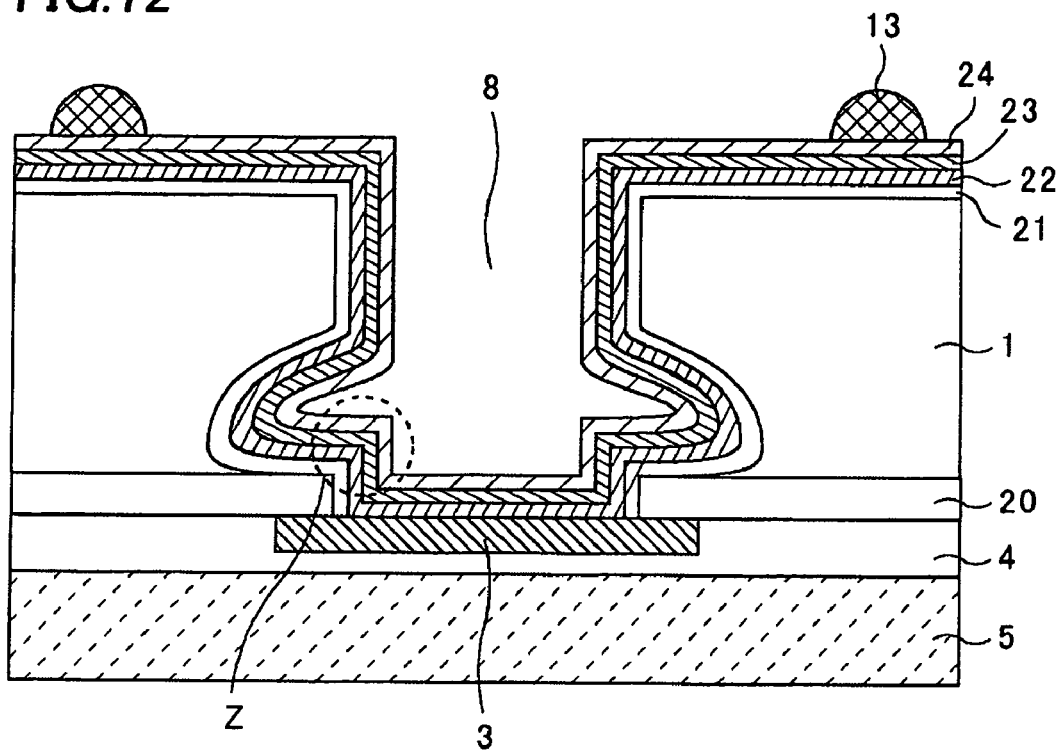
FIG. 12 is a reference view of the first embodiment of the invention.

Using this process, since the taper shape of the sidewall of the second opening 7B formed in the first insulation layer 2 is reflected on the shape of the end portion X of the second insulation layer 9A, the end portion X of the second insulation layer 9A is formed being gradually thinned toward the center of the via hole 8. Since the end portion X of the second insulation layer 9A covers the first insulation layer 2 along the slope thereof, there is no edge portion in the third opening 8A, forming a smoothly curving taper-shape, as shown in FIG. 5. Therefore, the inner sidewall of the via hole 8 can be made all smooth, enhancing coverage of each of the barrier layer 10, the seed layer 11, and the wiring layer 12 to be formed in subsequent processes. On the contrary, in a case of a sidewall of the first insulation layer 20 not formed in a taper shape and having an edge portion as shown in FIG. 12, a poor coverage region Z is formed in the second insulation film 21, the seed layer 22, the barrier layer 23, the wiring layer 24, and so on, and the film quality may be degraded at the region Z due to electric field concentration thereon.

The shape of the sidewall of the via hole 8 in the third opening 8A can be formed in the more smoothed taper-shape by the process of the embodiment than by a process where the first opening 7A is formed on the semiconductor substrate 1, then the second insulation layer 9 is formed on the first insulation layer 2 and on the semiconductor substrate 1 including in the first opening 7A, and a portion of the first insulation layer 2 and second insulation layer 9 is removed by etching at a time to expose the pad electrode 3. This is because the shape of the sidewall of the first insulation layer 2 is reflected on the shape of the end portion X of the second insulation layer 9A by the process of the embodiment. This embodiment uses such a process that the coverage of each of the barrier layer 10, the seed layer 11, the wiring layer 12 and so on to be formed in subsequent processes can be enhanced and a highly reliable semiconductor device can be manufactured.

Figure 6:
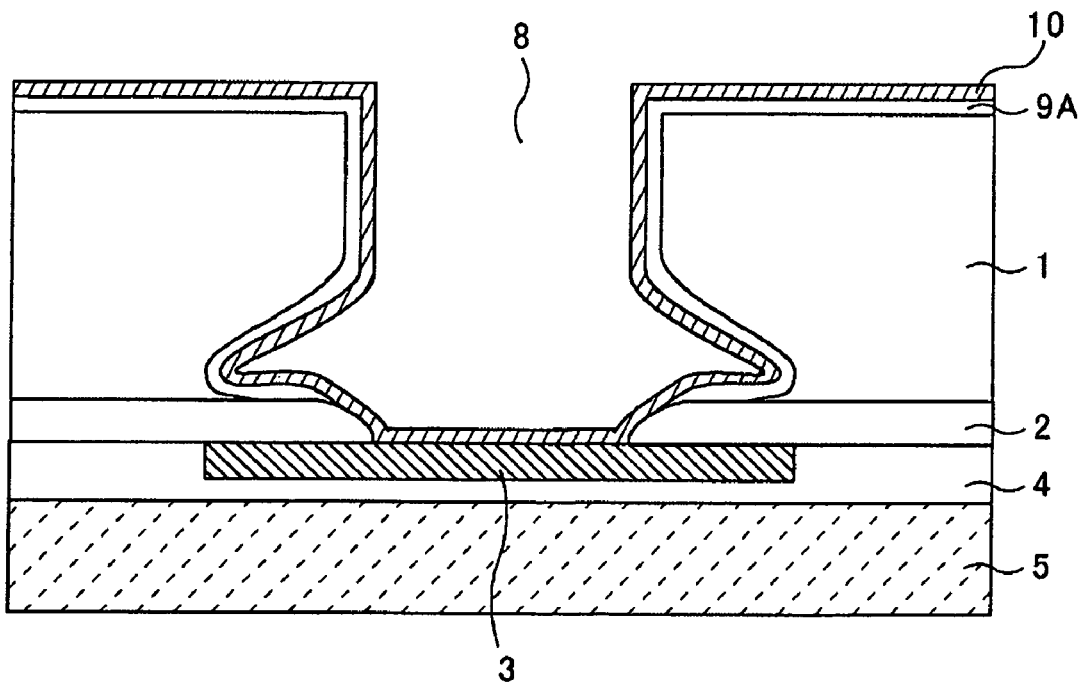

Then a barrier layer 10 is formed over the back surface of the semiconductor substrate 1 and the inner surface of the via hole 8, as shown in FIG. 6. The barrier layer 10 is preferably made of titanium nitride (TiN). Or it may be made of a refractory metal such as titanium (Ti) or tantalum (Ta), or a chemical compound of the refractory metal such as titanium tungsten (TiW) or tantalum nitride (TaN).

The second insulation layer 9A may be formed by removing the portion of the second insulation layer 9 on the pad electrode 3 using a photoresist layer (not shown) formed over the semiconductor substrate as a mask. Or it may be formed by etching without using the photoresist layer as the mask.

The difference in thickness of the second insulation layer 9 over the via hole 8 is utilized in the etching without using the photoresist layer as the mask. Although FIG. 4 shows the second insulation layer 9 of a uniform thickness, the second insulation layer 9 formed on the back surface of the semiconductor subrstrate 1 is, in practice, thicker than the second insulation layer 9 formed at the bottom of the via hole 8. In this embodiment, the second insulation layer 9 on the back surface of the semiconductor substrate 1 is twice as thick as the second insulation layer 9 at the bottom of the via hole 8. Even when the photoresist layer is not formed over the semiconductor substrate 1, a portion of the second insulation layer 9 located on the pad electrode 3 can be completely removed before the second insulation layer 9 on the back surface of the semiconductor substrate 1 is eliminated, taking advantage of the difference in the thickness.

Also, etching characteristics of the second insulation layer 9 is taken into account in this embodiment. That is, the etch rate of the second insulation layer 9 formed at the bottom of the via hole 8 is lower than the etch rate of the second insulation layer 9 formed on the back surface of the semiconductor substrate 1. The etch rate of the second insulation layer 9 formed on the back surface of the semiconductor substrate 1 is 1.5 times of the etch rate of the second insulation layer 9 formed at the bottom of the via hole 8, for example. Therefore, the reliability of the manufacturing process is improved by utilizing both the difference in the thickness of the second insulation layer 9 and the etching characteristics of the second insulation layer 9.

Figure 7:
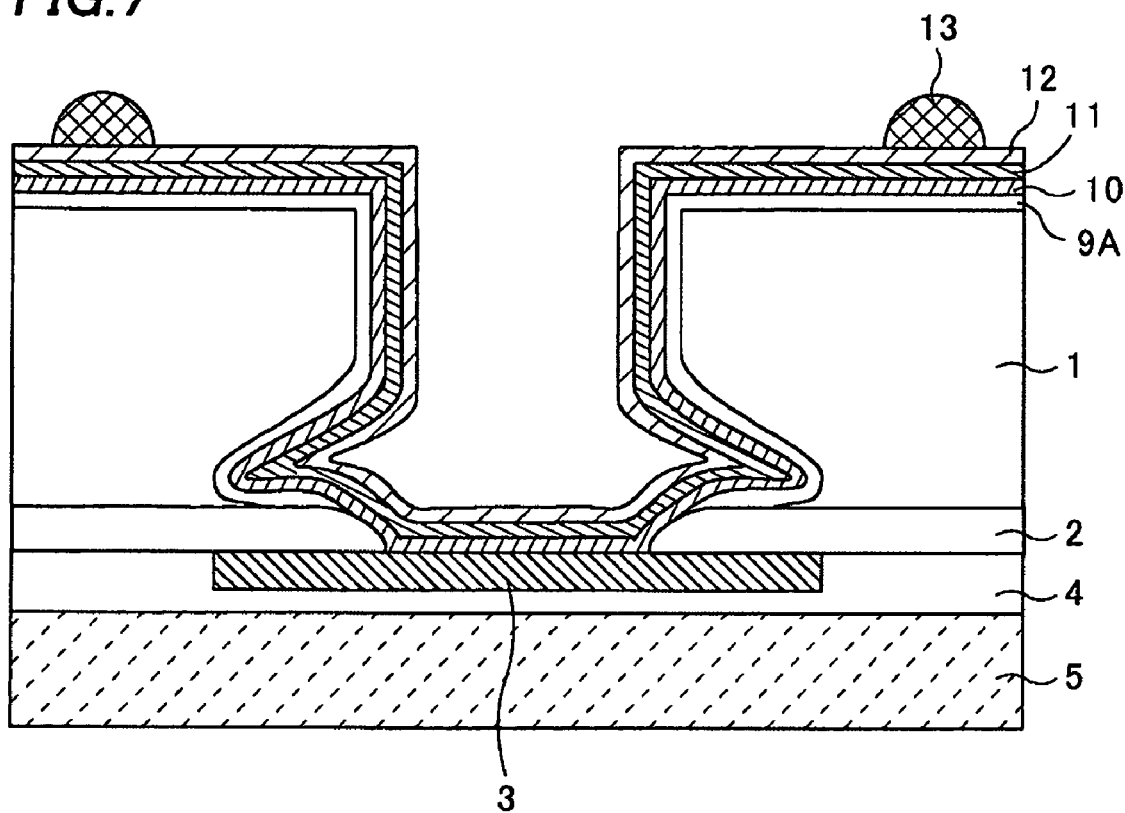

A seed layer 11 (a Cu layer, or the like) is formed on the barrier layer 10 and a wiring layer 12 made of copper (Cu), or the like, is formed on the seed layer 11 by plating, as shown in FIG. 7. As a result, the wiring layer 12 is electrically connected with the pad electrode 3 and extends over the back surface of the semiconductor substrate 1 through the via hole 8. The wiring layer 12 may be either patterned or not patterned. After a protection layer (not shown) is formed on the wiring layer 12, openings are formed in predetermined locations in the protection layer. Then, a metal layer (not shown) made of, for example, nickel and gold is formed on the wiring layer 12 exposed in the openings, and then a solder is screen-printed and reflowed by a heat treatment to form ball-shaped terminals 13 as conductive terminals (electrode connection portions). There can be a case where the ball-shaped terminals 13 are not formed as the conductive terminals according to a packaging mode. In this case, the wiring layer 12 or the metal layer (not shown) of nickel and gold is exposed, serving as the conductive terminals in packaging.

The barrier layer 10 and the seed layer 11 may be formed by MOCVD (Metal Organic Chemical Vapor Deposition). However, it increases the production cost. A directional sputtering such as long-throw sputtering is less expensive than the MOCVD and is capable of improving coverage compared with conventional sputtering. By using the directional sputtering, the barrier layer 10 and the seed layer 11 can be formed with a good coverage even when the via hole has a slope of less than 90 degrees or an aspect ratio of three or higher.

Then, the semiconductor substrate 1 and the layers stacked on it are cut along a predetermined dicing line into individual semiconductor dice, although not shown in the figure. A dicing method, an etching method, a laser cutting method, or the like is used as the method of dividing those into the individual semiconductor dice. A BGA type semiconductor device, in which the pad electrode 3 and the ball-shaped terminal 13 are electrically connected, is formed as described above.

According to this embodiment, the second insulation layer 9A, the barrier layer 10, the seed layer 11 and the wiring layer 12 formed on the sidewall of the via hole 8 are strongly adhered to the semiconductor substrate 1 and hardly detached from the semiconductor substrate 1, because the layers are mechanically engaged with the semiconductor substrate 1 at the extended-diameter portion of the via hole 8 formed by the lateral etching in the lower portion of the opening. In addition, the connection between the pad electrode 3, the seed layer 11 and the wiring layer 12 are improved.

Furthermore, the extended diameter of the via hole 8 exposing the pad electrode 3 relaxes the stresses generated in the seed layer 11 and the wiring layer 12 subsequently formed in the via hole 8, leading to improved reliability.

The second opening 7B is formed in the first insulation layer 2, continuing from the first opening 7A, so as to have the smaller diameter in a portion close to the pad electrode 3 than in a portion close to the front surface of the semiconductor substrate 1. This can further relax the stress since the stress is prevented from concentrating on an edge portion, compared with a semiconductor device where a diameter of an opening in a first insulation layer is uniform all through the first insulation film, for example.

Figure 13:
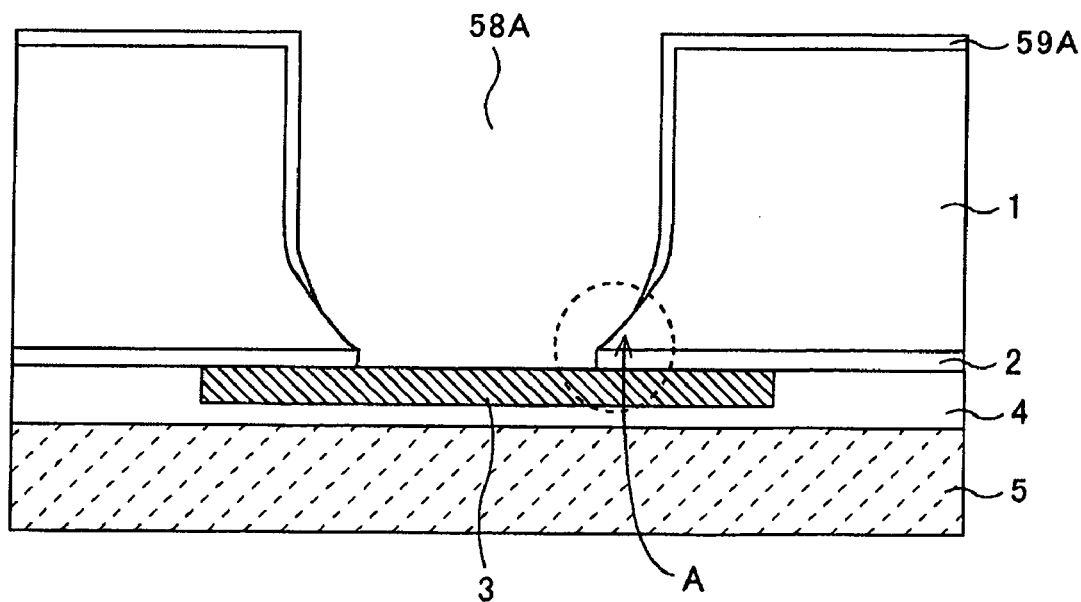
FIG. 13 is a cross-sectional view showing a semiconductor device of a prior art.
Figure 14A:
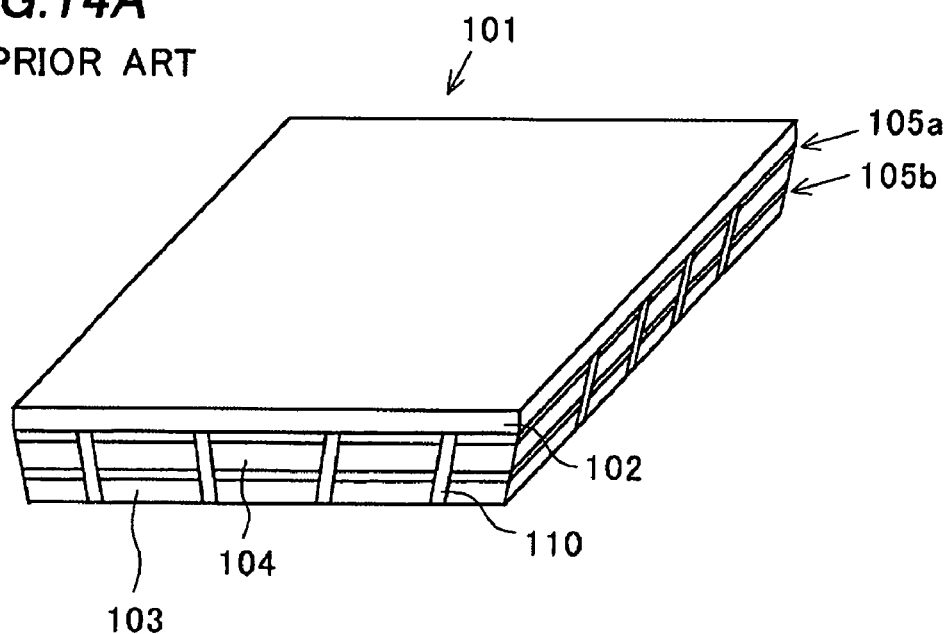
FIGS. 14A and 14B are oblique perspective views showing the semiconductor device of the prior art.
Figure 14B:
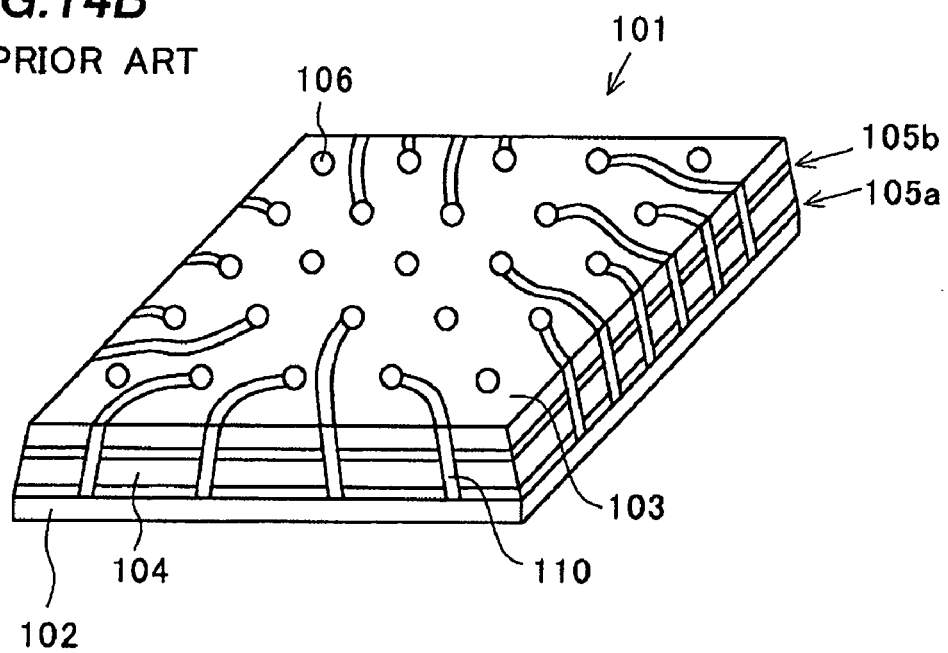

When the sidewall of the via hole is straight or tapered down toward the bottom or trailing at the bottom as shown in FIG. 13, the insulation layer 59A covering a sloped portion (portion A in FIG. 13) at the bottom of the via hole 58A may become extremely thin, or disconnected, during the etching to remove a portion of the insulation layer 59A at the bottom of the via hole 58A, leading to the decline in insulation at the portion. There is no such removal of the insulation layer and resulting insulation failure in the via hole according to this embodiment.

Since the connection between the pad electrode on the semiconductor die and the conductive terminal is made through the via hole, the disconnection and the decline in step coverage of the connection are prevented. Thus a highly reliable semiconductor device is made available.

Next, a second embodiment of the invention will be described referring to figures. The semiconductor device of the first embodiment and its manufacturing method may cause the pad electrode deformation, i.e., part of the pad electrode projecting into the space of the via hole 8, when the via hole 8 is formed.

This deformation of the pad electrode is caused by that the stress accumulated in the pad 10 electrode when the pad electrode is deposited in the front-end processes (also called residual stress or intrinsic stress) loses its balance by a thermal load in a thermal cycle test or the like, and thus the stress is concentrated in the pad electrode so as to be released therefrom. Such deformation of the pad electrode is likely to occur when the first opening 7A reaching the first insulation layer 2 is formed or when the first insulation layer 2 is etched to expose the pad electrode 3.

Furthermore, the deformation of the pad electrode 3 may occur when the pad electrode 3 is pulled toward the via hole 8 side while the barrier layer 10, the seed layer 11, or the wiring layer 12 is formed in the via hole 8. This deformation is caused by the difference in magnitude between residual stress accumulated in the barrier layer 10, the seed layer 11, or the wiring layer 12 when these layers are formed and stress accumulated in the pad electrode 3 when it is formed.

Furthermore, the deformation of the pad electrode 3 sometimes causes damage or disconnection in the pad electrode 3 and connection failure due to poor coverage of the barrier layer 10, the seed layer 11, or the wiring layer 12, resulting in reduction of reliability and a yield of the semiconductor device.

The second embodiment of the invention is directed to solving this problem. In the following description, the same numerals are used for the same structure as that of the described first embodiment and its description will be omitted.

First, the pad electrode 3 is formed on the front surface of the semiconductor subrstrate 1 including an electronic device (not shown) through the first insulation layer 2, in the same manner as shown FIG. 1. The pad electrode 3 is deposited flat, but a certain amount of stress is accumulated therein. Then, the supporting body 5 is attached to the front surface of the semiconductor substrate 1 through the adhesive layer 4.

Figure 8:
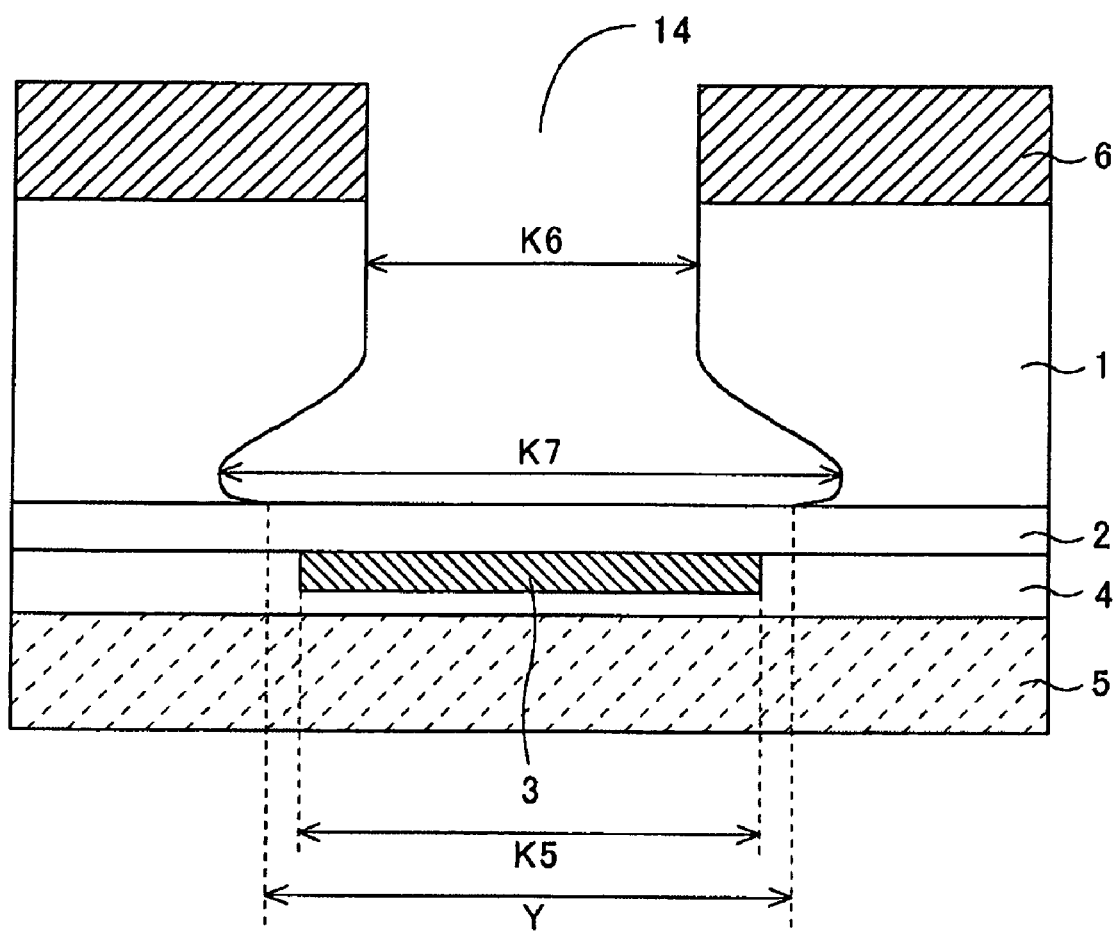
FIGS. 8 to 10C are cross-sectional views showing a method of manufacturing a semiconductor device of a second embodiment of the invention.
Figure 9:
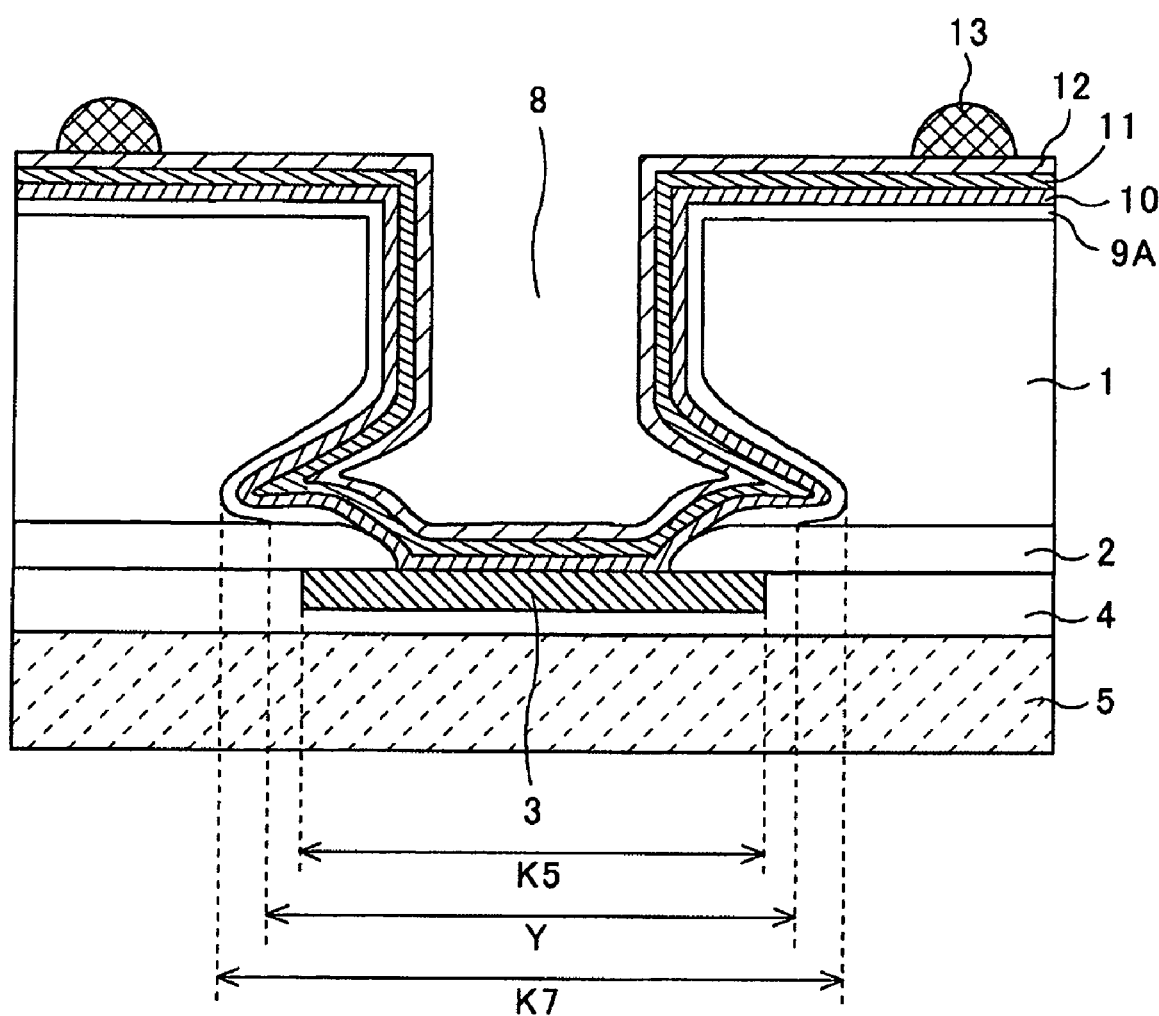

Next, as shown in FIG. 8, the photoresist layer 6 is formed on the back surface of the semiconductor substrate 1, having an opening corresponding to the pad electrode 3. The semiconductor subrstrate 1 is etched using the photoresist layer 6 as a mask to form the first opening 14 reaching the first insulation layer 2. The etching of the semiconductor substrate 1 is performed so that a diameter Y of the first opening 14 at its bottom becomes larger than a width K5 of the pad electrode 3. The diameter Y of the first opening 14 at its bottom is a diameter thereof on the front surface side of the semiconductor substrate 1 at a boundary of the semiconductor substrate 1 and the first insulation layer 2. It is noted that a numeral K6 in FIG. 8 shows a diameter of the first opening 14 in a portion close to the back surface of the semiconductor substrate 1, and a numeral K7 shows a diameter thereof in a portion laterally widened close to the front surface of the semiconductor substrate 1. The description of the subsequent processes will be omitted since these are the same as described above. The semiconductor device of the second embodiment is thus completed as shown in FIG. 9.

Figure 10A:
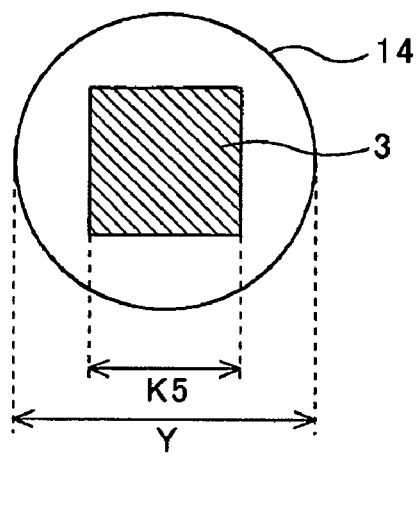
Figure 10B:
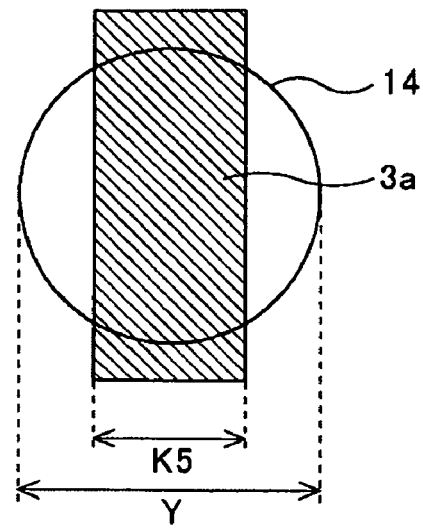
Figure 10C:
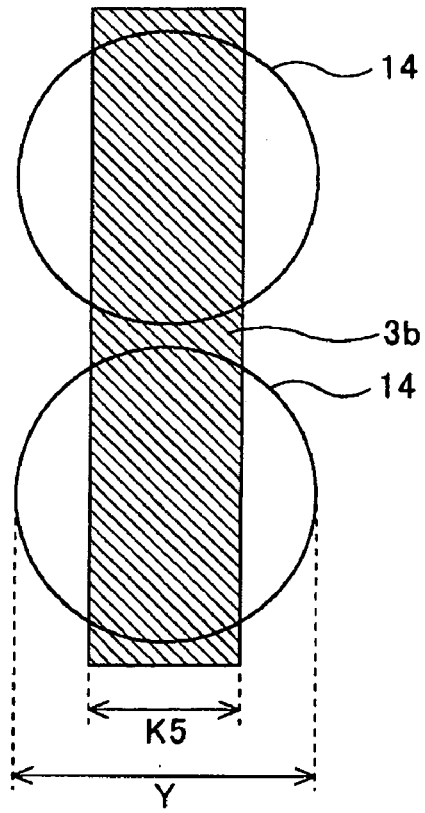

FIGS. 10A, 10B, and 10C are plan views showing a positional relation between the pad electrode 3 and the bottom portion of the first opening 14, and FIG. 10A shows an example that the diameter Y of the first opening 14 at its bottom is larger than the width K5 of the pad electrode 3.

The diameter Y of the first opening 14, which is larger than the width K5 of the pad electrode 3, can make stress accumulated when the pad electrode 3 is deposited effectively released when the first opening 7A reaching the first insulation layer 2 is formed or the first insulation layer 2 is etched to expose the pad electrode 3, thereby preventing the pad electrode 3 from projecting toward the via hole 8 side. This prevents damage or disconnection of the pad electrode 3, improves coverage of the layers (the barrier layer 10, the seed layer 11, the wiring layer 12, or the like) formed on the pad electrode 3 to prevent connection failure between the layers and the pad electrode 3, resulting in improvement of reliability and a yield of the semiconductor device.

Furthermore, FIG. 10B shows an example that the first opening 14 has both portions at its bottom that are larger and smaller than the pad electrode 3a, and FIG. 10C shows an example that a plurality of first openings 14 are formed for a pad electrode 3b. Even when the pad electrode is thus partially positioned under the first opening 14, stress accumulated in the pad electrode can be released in a region where the diameter Y is larger than the pad electrode, thereby preventing the pad electrode from projecting and thus improving the reliability and the yield of the semiconductor device.

The wiring layer 12 is not necessarily made by plating as described in the embodiment. The wiring layer 12 may also be made, for example, without forming the seed layer 11 by a method other than the plating. It may be made by sputtering of, for example, aluminum or aluminum alloy.

This embodiment is not limited to the semiconductor device where the ball-shaped terminals 13 are formed as described above. The embodiment may be applied to any semiconductor device as long as a via hole is formed to penetrate a semiconductor substrate, for example, a LGA (Land Grid Array) type semiconductor device.

Figure 11A:
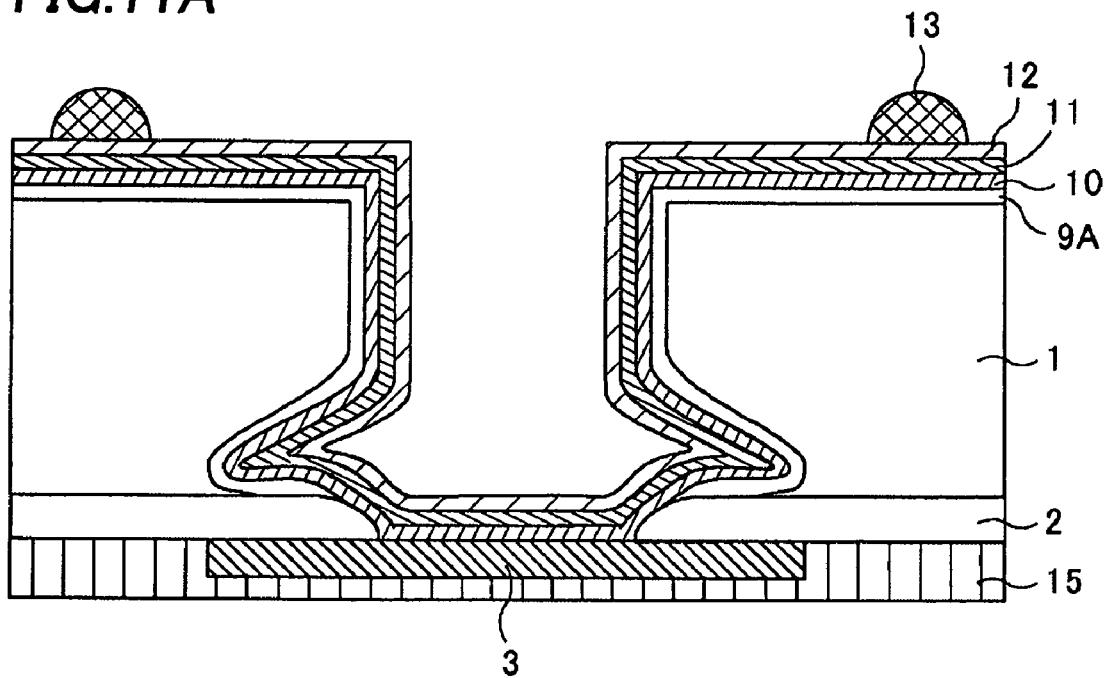
FIGS. 11A and 11B are views showing a positional relation between a pad electrode and a diameter of a first opening at its bottom of the first and second embodiments of the invention.
Figure 11B:
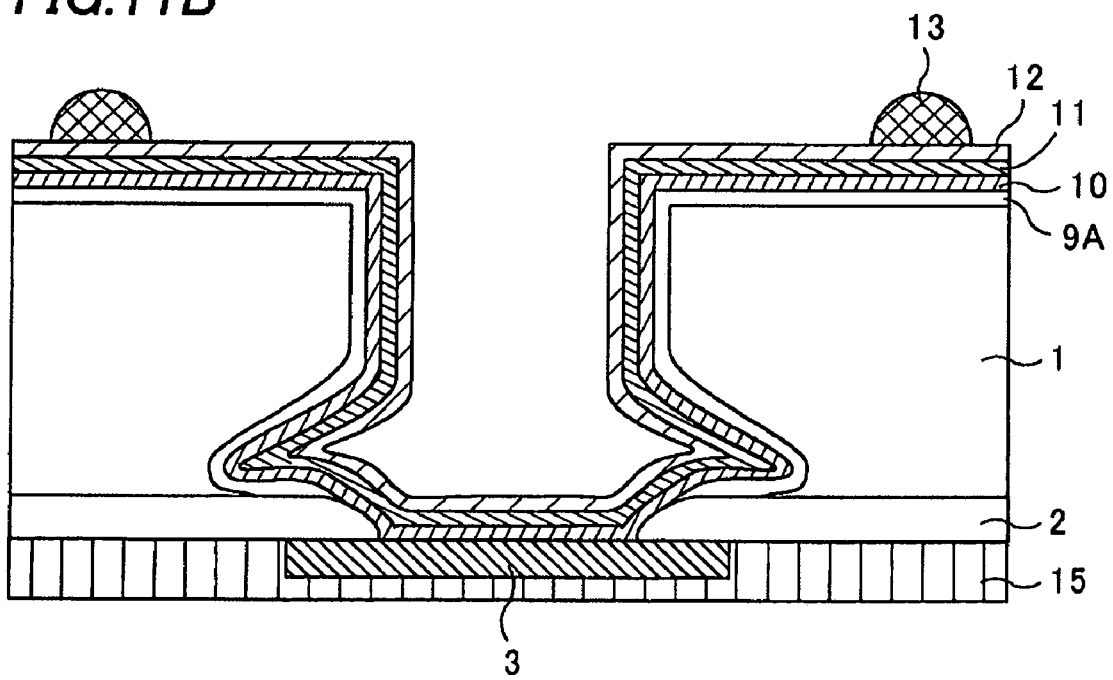

Although the supporting body 5 is attached to the front surface of the semiconductor substrate 1 in the described embodiments, the embodiment can be applied to a semiconductor device without the supporting body 5 and its manufacturing method, as shown in FIGS. 11A and 11B. Alternatively, it is possible to remove the supporting body 5 after the semiconductor device is completed. Description of other structures shown in FIGS. 11A and 11B will be omitted since these are almost the same as the structures of the first embodiment and the second embodiment, respectively.

In FIGS. 11A and 11B, the semiconductor substrate 1 including the pad electrode 3 is covered with a protection film 15 made of an insulator (e.g. a passivation film or a film layered with a passivation film and resin such as polyimide). Although the protection film 15 completely covers the pad electrode 3 in FIGS. 11A and 11B, it is possible that the protection film 15 covers a part of the pad electrode 3 to expose a part of the pad electrode 3. A wire can be bonded to the exposed pad electrode 3, or a conductive terminal such as a bump electrode can be formed on the exposed pad electrode 3. Alternatively, it is possible to connect the pad electrode 3 to a conductive terminal of the other semiconductor device when the semiconductor device is to be layered on the other semiconductor device.

Although the via hole 8 is circular in its lateral shape in the described embodiments, the via hole 8 can also form any shape such as an oval or a square in its lateral shape.

What is claimed is:

1. A semiconductor device comprising:
    a semiconductor substrate comprising a front surface and a back surface and having a first opening penetrating the semiconductor substrate from the back surface to the front surface;
    a first insulation layer disposed on the front surface of the semiconductor substrate and having a second opening that is connected to the first opening; and
    a pad electrode disposed on the first insulation layer so as to cover the second opening,
    wherein the first opening has a maximum lateral size thereof in a position closer to the front surface than to the back surface, a lateral size of the second opening increases from the pad electrode toward the first opening, and the maximum lateral size of the first opening is larger than a lateral size of the first opening at the back surface wherein a diameter of the first opening at the front surface is larger than a width of the pad electrode and a diameter of the second opening is smaller than the width of the pad electrode.

2. The semiconductor device of claim 1, wherein the first and second openings are circular in a lateral shape thereof.

3. The semiconductor device of claim 1, further comprising a second insulation layer or a conductive layer that is disposed on a sidewall of the first opening and on a sidewall of the second opening.

4. The semiconductor device of claim 1, further comprising a second insulation layer disposed on a sidewall of the first opening, wherein an end portion of the second insulation layer is gradually thinned toward a center of the second opening.

5. The semiconductor device of claim 1, further comprising a supporting body formed on the front surface of the semiconductor substrate.

6. The semiconductor device of claim 4, wherein a terminal part of the thinned end portion of the second insulation layer is located on the first insulation layer.

* * * * *